US010825823B1

(12) United States Patent
Lin

(10) Patent No.: US 10,825,823 B1
(45) Date of Patent: *Nov. 3, 2020

(54) SEMICONDUCTOR MEMORY DEVICE INCLUDING DECOUPLING CAPACITOR ARRAY ARRANGED OVERLYING ONE-TIME PROGRAMMABLE DEVICE

(71) Applicant: NANYA TECHNOLOGY CORPORATION, New Taipei (TW)

(72) Inventor: Shian-Jyh Lin, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/397,412

(22) Filed: Apr. 29, 2019

(51) Int. Cl.
  *H01L 27/112* (2006.01)
  *H01L 21/265* (2006.01)
  *H01L 49/02* (2006.01)
  *H01L 21/28* (2006.01)

(52) U.S. Cl.
  CPC ...... *H01L 27/11206* (2013.01); *H01L 21/265* (2013.01); *H01L 28/40* (2013.01); *H01L 29/40114* (2019.08)

(58) Field of Classification Search
  CPC ......... H01L 27/10808; H01L 27/10897; H01L 27/11206; H01L 27/11286; H01L 2924/145; H01L 2924/1451; H01L 2924/14511; H01L 2924/1453; H01L 23/5252

See application file for complete search history.

(56) References Cited

U.S. PATENT DOCUMENTS

| | | | | |
|---|---|---|---|---|
| 9,666,262 | B2* | 5/2017 | Kim | ......................... G11C 5/14 |
| 2003/0116799 | A1* | 6/2003 | Taniguchi | ......... H01L 27/10894 |
| | | | | 257/303 |
| 2010/0065944 | A1* | 3/2010 | Tu | ..................... H01L 27/10852 |
| | | | | 257/532 |
| 2019/0393231 | A1* | 12/2019 | Sreeramaneni | ..... H01L 23/5256 |

FOREIGN PATENT DOCUMENTS

| TW | 503959 B | 10/2015 |
|---|---|---|
| TW | 525750 B | 3/2016 |

OTHER PUBLICATIONS

Office Action dated Jun. 19, 2020 in TW Application No. 108126679.
Office Action dated Jun. 4, 2020 in U.S. Appl. No. 16/517,306.

* cited by examiner

*Primary Examiner* — Matthew E. Gordon
(74) *Attorney, Agent, or Firm* — Muncy, Geissler, Olds & Lowe, P.C.

(57) ABSTRACT

The present disclosure provides a semiconductor chip. The semiconductor chip includes a substrate, a main device, a one-time-programmable (OTP) device and a decoupling capacitor array. The substrate includes a first region and a second region. The main device is in the first region, the OTP device and the decoupling capacitor array are in the second region, and the decoupling capacitor array overlies the OTP device.

14 Claims, 13 Drawing Sheets

SEMICONDUCTOR MEMORY DEVICE INCLUDING DECOUPLING CAPACITOR ARRAY ARRANGED OVERLYING ONE-TIME PROGRAMMABLE DEVICE

TECHNICAL FIELD

The present disclosure relates to a semiconductor structure, a semiconductor chip and a method of manufacturing the semiconductor structure, and more particularly, to a semiconductor structure including a stacked one-time-programmable (OTP) device and decoupling capacitor array, a semiconductor chip including the semiconductor structure, and a method of manufacturing the semiconductor structure.

DISCUSSION OF THE BACKGROUND

Integrated circuits have experienced continuous rapid growth due to constant improvements in the integration density of various electronic components. The integrated components of a semiconductor occupy volume near the surface of the semiconductor wafer. Although dramatic improvements in lithography have resulted in considerable improvements in two-dimensional (2D) integrated circuit formation, there are physical limitations to the density that can be achieved in two dimensions.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate, a plurality of one-time-programmable (OTP) cells and a decoupling capacitor array. The substrate includes a plurality of active areas and an isolation structure provided between the active areas to isolate the active areas from one another. The plurality of OTP cells are disposed in the active areas. The decoupling capacitor array overlies the OTP cells.

In some embodiments, the semiconductor structure further includes an inter-layer dielectric sandwiched between the OTP cells and the decoupling capacitor array to electrically isolate the OTP cells from the decoupling capacitor array.

In some embodiments, at least one of the plurality of OTP cells includes a first diffusion region, a control bit line, a plurality of second diffusion regions, a plurality of buried word lines, a plurality of cell dielectrics, and a plurality of cell bit lines, wherein the first diffusion region is in the substrate, the control bit line is disposed on the first diffusion region; the plurality of second diffusion regions are in the substrate and at opposite sides of the first diffusion region; the plurality of buried word lines are in the substrate and between the first diffusion region and the second diffusion regions; the plurality of cell dielectrics are disposed in the second diffusion regions; and the plurality of cell bit lines are disposed on the cell dielectrics.

In some embodiments, the active areas extend along a first direction, the buried word lines extend along a second direction and intersect with the active areas at an angle of less than 90 degrees, and the control bit line and the cell bit lines extend along a third direction substantially perpendicular to the second direction.

In some embodiments, the angle is in a range between 15 and 60 degrees.

In some embodiments, at least one of the plurality of buried word lines includes a conductor disposed in the substrate and an insulating liner disposed between the substrate and the conductor.

In some embodiments, the decoupling capacitor array includes an insulating layer, a first conductive layer and a second conductive layer; the first conductive layer is disposed over the OTP cells and beneath the insulating layer, and second conductive layer is disposed on the insulating layer.

Another aspect of the present disclosure provides a semiconductor chip. The semiconductor chip includes a first region including a main device and a second region including a one-time-programmable (OTP) device and a decoupling capacitor array, wherein the decoupling capacitor array vertically overlies the OTP device.

In some embodiments, the semiconductor chip further includes a substrate extending to comprise a portion of the main device and a portion of the OTP device.

In some embodiments, the OTP device includes a plurality of OTP cells, and at least one of the plurality of OTP cells is disposed in an active area of the substrate and includes a first diffusion region, a control bit line, a plurality of second diffusion regions, a plurality of buried word lines, a plurality of cell dielectrics, and a plurality of cell bit lines, wherein the first diffusion region is in the substrate, the control bit line is disposed on the first diffusion region, the plurality of second diffusion regions are in the substrate and at opposite sides of the first region, the plurality of buried word lines are in the substrate and between the first diffusion region and the second diffusion regions, the plurality of cell dielectrics are disposed on the second diffusion regions, and the plurality of cell bit lines are disposed on the cell dielectrics.

In some embodiments, the semiconductor chip further includes an inter-layer dielectric covering the control bit line, the buried word lines, the cell bit lines and a portion of the substrate.

In some embodiments, the decoupling capacitor array includes a first conductive layer, a second conductive layer and an insulating layer; the first conductive layer is formed in the inter-layer dielectric, the second conductive layer is disposed over the first conductive layer, and the insulating layer is disposed between the first conductive layer and the second conductive layer.

In some embodiments, the main device includes a plurality of access transistors and a plurality of storage capacitors disposed over the access transistors and electrically coupled to the access transistors.

In some embodiments, the main device further comprises an isolation layer disposed between the access transistor and the storage capacitor, and a plug disposed in the isolation layer and connecting the access transistor to the storage capacitor. The inter-layer dielectric is formed in a manner similar to that of the isolation layer, and the first conductive layer is formed in a manner similar to that of the plug. The decoupling capacitor array is electrically isolated from the OTP device.

Another aspect of the present disclosure provides a method of manufacturing a semiconductor structure. The method includes steps of providing a substrate formed with a plurality of line-shaped active areas and an isolation structure between the line-shaped active areas to isolate the line-shaped active areas; forming a plurality of buried word lines in the line-shaped active area; implanting ions in the line-shaped active areas to form a first diffusion region and a plurality of second diffusion regions on either side of the buried word lines; depositing cell dielectrics on the second diffusion regions; depositing a control bit line on the first diffusion region; depositing a plurality of cell bit lines on the cell dielectric; depositing an inter-layer dielectric on the buried word lines, the control bit line and the cell bit lines; depositing a first conductive layer on the inter-layer dielectric; depositing an insulating layer on the first conductive layer; and depositing a second conductive layer on the insulating layer.

In some embodiments, the method further includes a step of performing a planarization process after the deposition of the inter-layer dielectric.

In some embodiments, the method further includes a step of performing an etching process to recess the buried word lines into the substrate.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
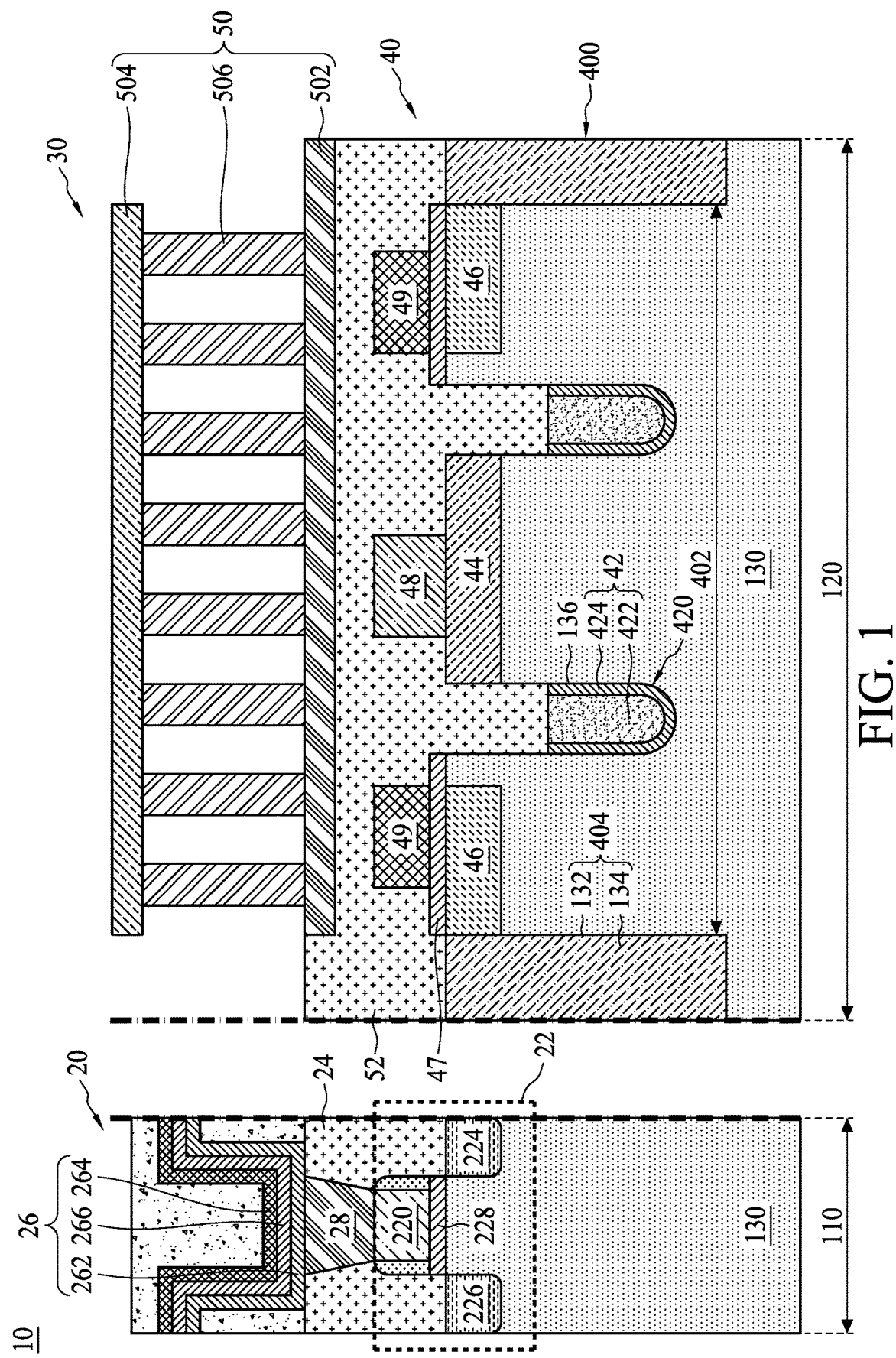
FIG. 1 is a cross-sectional view of a semiconductor chip in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor chip 10 in accordance with some embodiments of the present disclosure. Referring to FIG. 1, the semiconductor chip 10, which may have system-on-chip (SoC) applications built therein, includes a first region 110 and a second region 120. In some embodiments, the first region 110 includes one or more main devices 20; in the second region 120, a semiconductor structure 30 is formed, wherein the semiconductor structure 30 includes a one-time-programmable (OTP) device 40, used for a repair in the main device 20, and a decoupling capacitor array 50 that vertically overlaps the OTP device 40. The decoupling capacitor array 50 typically has a capacitance sufficient to supply an electrical current to on-chip circuits.

In some embodiments, the main device 20 may be a volatile memory device or a nonvolatile memory device, such as a dynamic random access memory (DRAM), an electrically erasable programmable read-only memory (EEPROM) or a flash memory. In some embodiments, the first region 110 may further include analog circuits, radio frequency (RF) circuits, logic operation circuits, or a combined circuit including more than one of these circuits. In some embodiments, the OTP device 40 may be also used for trimming an internal operation voltage or a frequency in the main device 20 where the analog circuits and the logic operation circuits exist together.

In some embodiments, the semiconductor chip 10 further includes a substrate 130 extending through the first region 110 and the second region 120. In some embodiments, the substrate 130 may be a silicon substrate or a substrate including other semiconductor materials, such as germanium, silicon germanium or other known semiconductor materials. In some embodiments, the substrate 130 extends to comprise a portion of the main device 20 and the OTP device 40.

If the main device 20 includes one or more DRAMs, the substrate 130 in the first region 110 is formed with a plurality of access transistors 22, such as metal-oxide-semiconductor field effect transistors (MOSFETs) 22, having gate structures 220, drain regions 224 and source regions 226 thereon. In some embodiments, the gate structures 220 may include polysilicon and may be formed by a chemical vapor deposition (CVD) process. In some embodiments, gate dielectrics 228 may be sandwiched between the substrate 130 and the gate structures 220. In some embodiments, the gate dielectrics 228 include oxide, nitride or oxynitride, but are not limited thereto. In some embodiments, the gate dielectrics 228 may be formed by a thermal oxidation process or a CVD process. In some embodiments, the gate dielectric 228 may be in a range of 30 to 250 angstroms.

In some embodiments, an isolation layer 24 is disposed to cover the substrate 130 and the gate structures 220. The isolation layer 24 is preferably formed of silicon oxide. In some embodiments, the isolation layer 24 is typically deposited with a low-pressure CVD process or a plasma-enhanced CVD process. After the isolation layer 24 is deposited, a planarization process using any suitable method, such as an etch-back process or a chemical mechanical polishing (CMP) process, is optionally performed on the isolation layer 24 for providing better topography.

The main device 20 further includes a plurality of storage capacitors 26 disposed over the access transistors 22. Either the drain region 224 or the source region 226 of access transistor 22 is connected to one terminal of one of the storage capacitors 26 through a plug 28 penetrating through the isolation layer 24. In some embodiments, the plug 28 may be formed of doped polysilicon or metal such as aluminum, copper or tungsten. In some embodiments, the storage capacitor 26 includes a bottom electrode 262 formed in the isolation layer 24 and electrically coupled to the plug 28, a top electrode 264 disposed over the bottom electrode 262, and a capacitor insulator 266 disposed between the bottom electrode 262 and the top electrode 264. In some embodiments, the bottom electrode 262, the top electrode 264 and the capacitor insulator 266 may be substantially conformal layers. In some embodiments, the bottom electrode 262 and the top electrode 264 are formed of doped polysilicon, aluminum, copper or tungsten. In some embodiments, the capacitor insulator 266 may include silicon dioxide ($SiO_2$), silicon nitride ($Si_3N_4$), or high-k materials such as zirconium oxide ($Zr_2O_2$), hafnium oxide ($HfO_2$), titanium oxide ($TiO_2$), or aluminum oxide ($Al_2O_2$). In some embodiments, the capacitor insulator 266 may be formed of either a double film of nitride/oxide film or a triple film of oxide/nitride/oxide.

In some embodiments, the OTP device 40 is programmed to store a binary data value. In some embodiments, the OTP device 40, electrically programmed, may be an antifuse-based device or a fuse-based device. In some embodiments, the antifuse-based device and the fuse-based devices are alterable to a conductive state; equivalently, the binary states can be one of either high resistance or low resistance in response to electric stress, such as a programming voltage or current. In detail, the antifuse-based device is an electronic device that changes state from not conducting to conducting. In contrast, the fuse-based device is an electronic device that changes state from conducting to not conducting.

Figure 2:
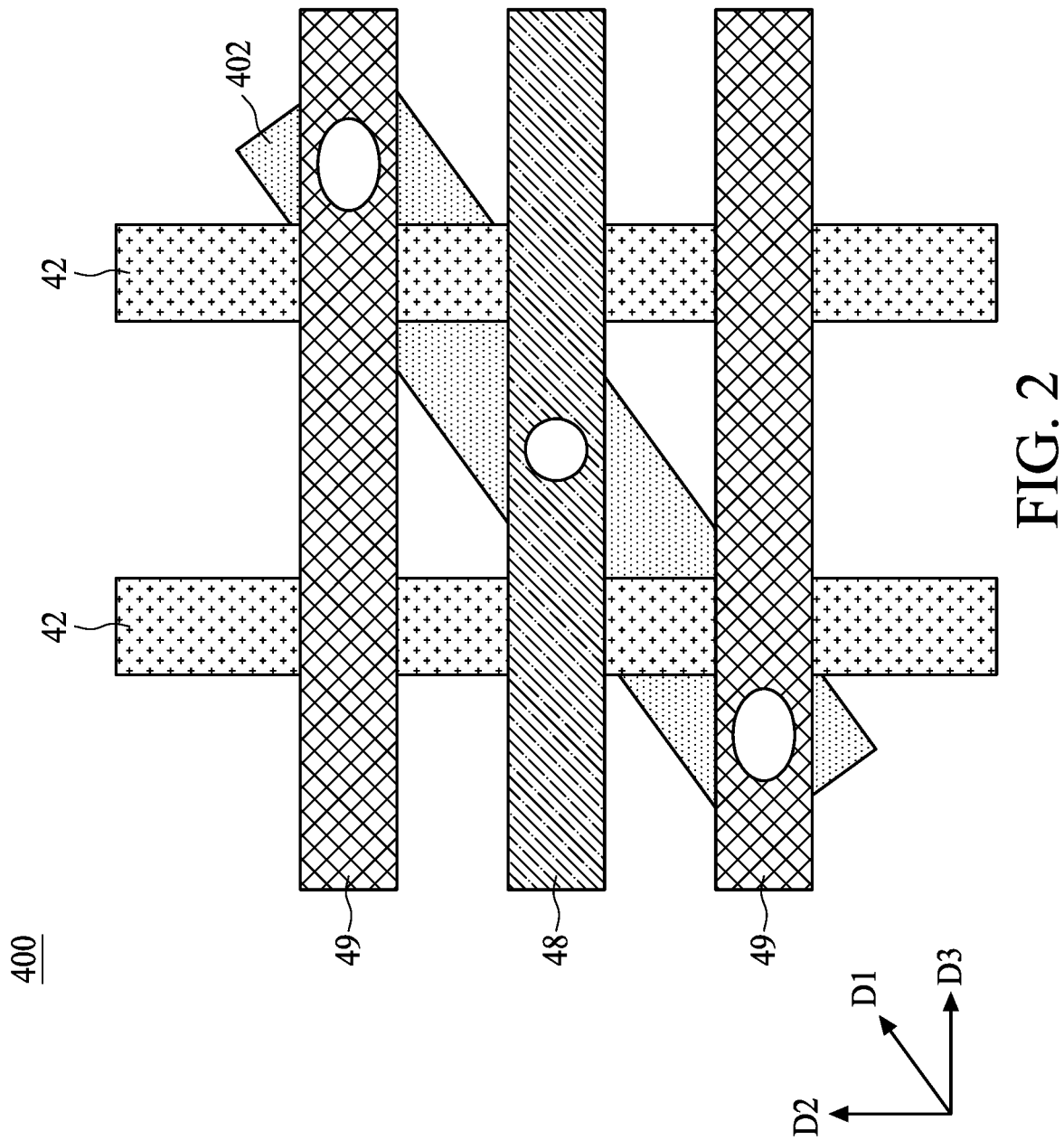
FIG. 2 is a plan view of a one-time-programmable cell in accordance with some embodiments of the present disclosure.

When the OTP device 40 is the anti-fuse device, it includes a plurality of OTP cells 400 as shown in FIG. 2. Referring to FIGS. 1 and 2, in some embodiments, the substrate 130 in the second region 120 is formed with a plurality of line-shaped active areas 402 and an isolation structure 404 provided between the line-shaped active areas 402 to isolate the line-shaped active areas 402 from one another. In some embodiments, the line-shaped active areas 402 extend along a first direction D1.

In some embodiments, the OTP device 40 further includes a plurality of buried word lines 42 extending along a second direction D2 and intersecting the line-shaped active areas 402 at an angle θ of less than 90 degrees. In some embodiments, the angle θ is preferably in a range between 15 and 60 degrees, but should not be limited thereto. In some embodiments, the buried word line 42 is embedded at a lower portion of a word line trench 420 in the substrate 130. In some embodiments, the buried word line 42 may be composed of a conductor 422, which may include a single layer of metal or multiple layers of conductive materials. In some embodiments, the buried word line 42 may be encapsulated by an insulating liner 424 between the substrate 130 and the conductor 422. In some embodiments, the insulating liners 424 may include oxide or nitride for electrically isolating the buried word lines 42 from the substrate 130.

In some embodiments, the OTP device 40 further includes a first diffusion region 44, coupled to a control bit line 48, and a plurality of second diffusion regions 46 on either side of the buried word lines 42. In some embodiments, the control bit line 48 and a plurality of cell bit lines 49 extend along a third direction D3 substantially perpendicular to the second direction D2. In some embodiments, the first diffusion region 44 is an n+ doped region, and the second diffusion regions 46 are n− doped regions. In some embodiments, the first diffusion region 44 and the second diffusion regions 46 are doped to accommodate programming voltages or currents. In some embodiments, the first diffusion region 44 may be connected to the control bit line 48 and the second diffusion regions 46 may be connected to the cell bits lines 49 through bit line contacts (not shown).

In some embodiments, the OTP device 40 further includes a plurality of cell dielectrics 47 disposed on the second diffusion regions 46 and the substrate 130, and the cell bit lines 49 are disposed on the cell dielectric 47. In some embodiments, a thickness of the cell dielectrics 47 determines a breakdown voltage of the OTP cell 400. In some embodiments, the cell dielectric 47 may be formed of oxide, nitride or oxynitride. In some embodiments, the control bit line 48 and the cell bit lines 49 may be made of polysilicon.

In some embodiments, the semiconductor structure 30 may further include an inter-layer dielectric 52 disposed between the OTP device 40 and the decoupling capacitor array 50 for electrically isolating the OTP device 40 from the decoupling capacitor array 50. In some embodiments, the inter-layer dielectric 52 covers the cell dielectric 47, the control bit line 48 and the cell bit lines 49, and extends into the word line trenches 420. In some embodiments, the inter-layer dielectric 52 is formed in a manner similar to that of the isolation layer 24. In some embodiments, the inter-layer dielectric 52 and the isolation layer 24 may be formed by the same process.

In some embodiments, the decoupling capacitor array 50 includes a first conductive layer 502 formed in the inter-layer dielectric 52, a second conductive layer 504 over the first conductive layer 502, and an insulating layer 506 disposed between the first conductive layer 502 and the second conductive layer 504. In some embodiments, the first conductive layer 502 may be formed of doped polysilicon or metal such as aluminum, copper or tungsten. In some embodiments, the first conductive layer 502 and the plug 28 may be formed by the same process. In some embodiments, the second conductive layer 504 may be formed of low-resistivity material, such as titanium nitride or combinations of titanium nitride, tantalum nitride, tungsten nitride, ruthenium, iridium, and platinum. In some embodiments, the insulating layer 506 may include silicon dioxide, silicon nitride, or high-k materials such as zirconium oxide, hafnium oxide, titanium oxide, and aluminum oxide. In some embodiments, the insulating layer 506 may include a plurality of strips spaced apart from one another by a given distance.

Figure 3:
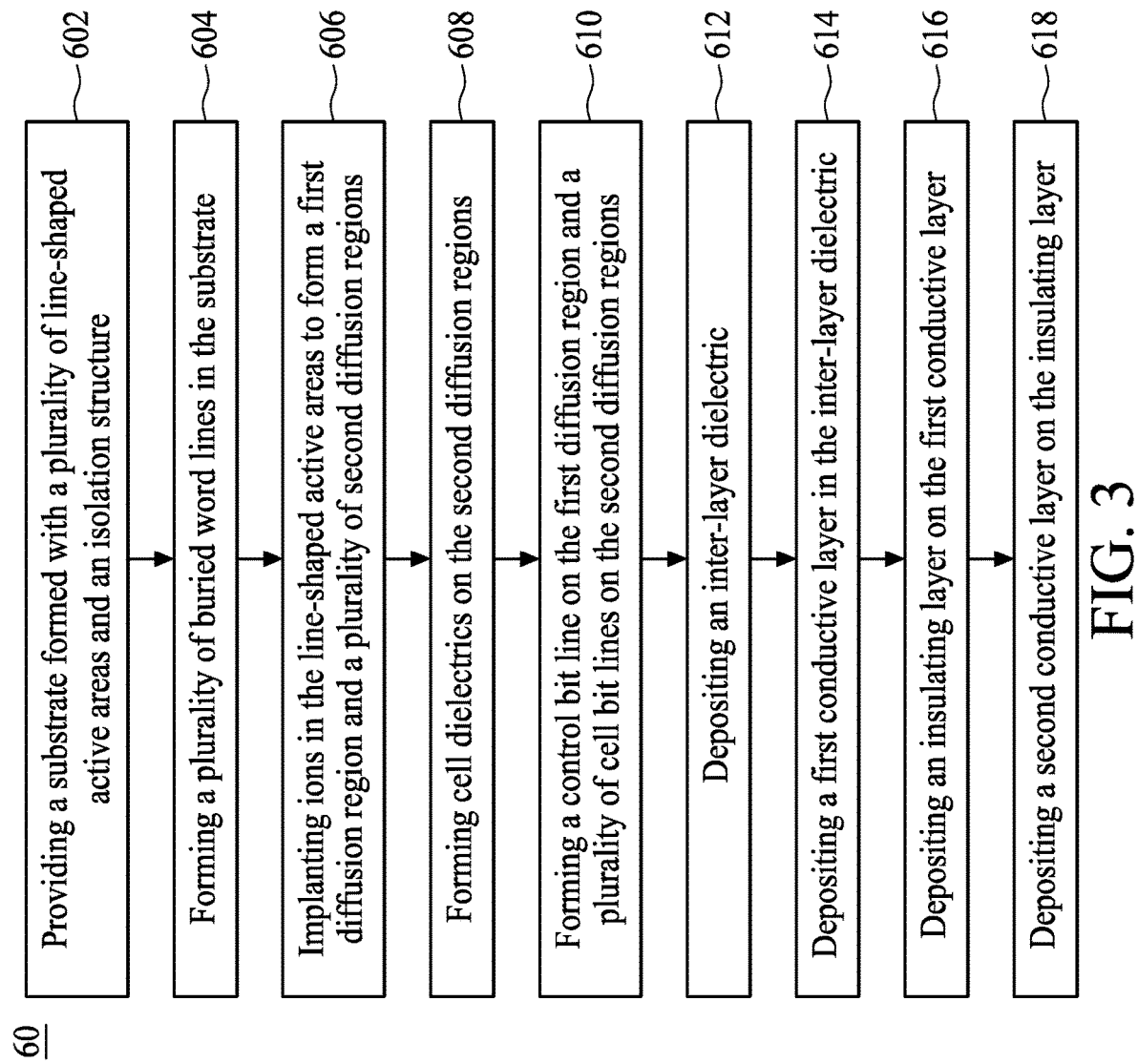
FIG. 3 is a flow diagram illustrating a method of manufacturing a semiconductor structure in accordance with some embodiments of the present disclosure.

FIG. 3 is a flow diagram illustrating a method 60 of manufacturing a semiconductor structure 30 in accordance with some embodiments of the present disclosure. FIGS. 4 to 13 are schematic diagrams illustrating various fabrication stages constructed according to the method 60 for manufacturing the semiconductor structure 30 in accordance with some embodiments of the present disclosure. The stages shown in FIGS. 4 to 13 are also illustrated schematically in the flow diagram in FIG. 3. In the subsequent discussion, the fabrication stages shown in FIGS. 4 to 13 are discussed in reference to the process steps shown in FIG. 3.

Figure 4:
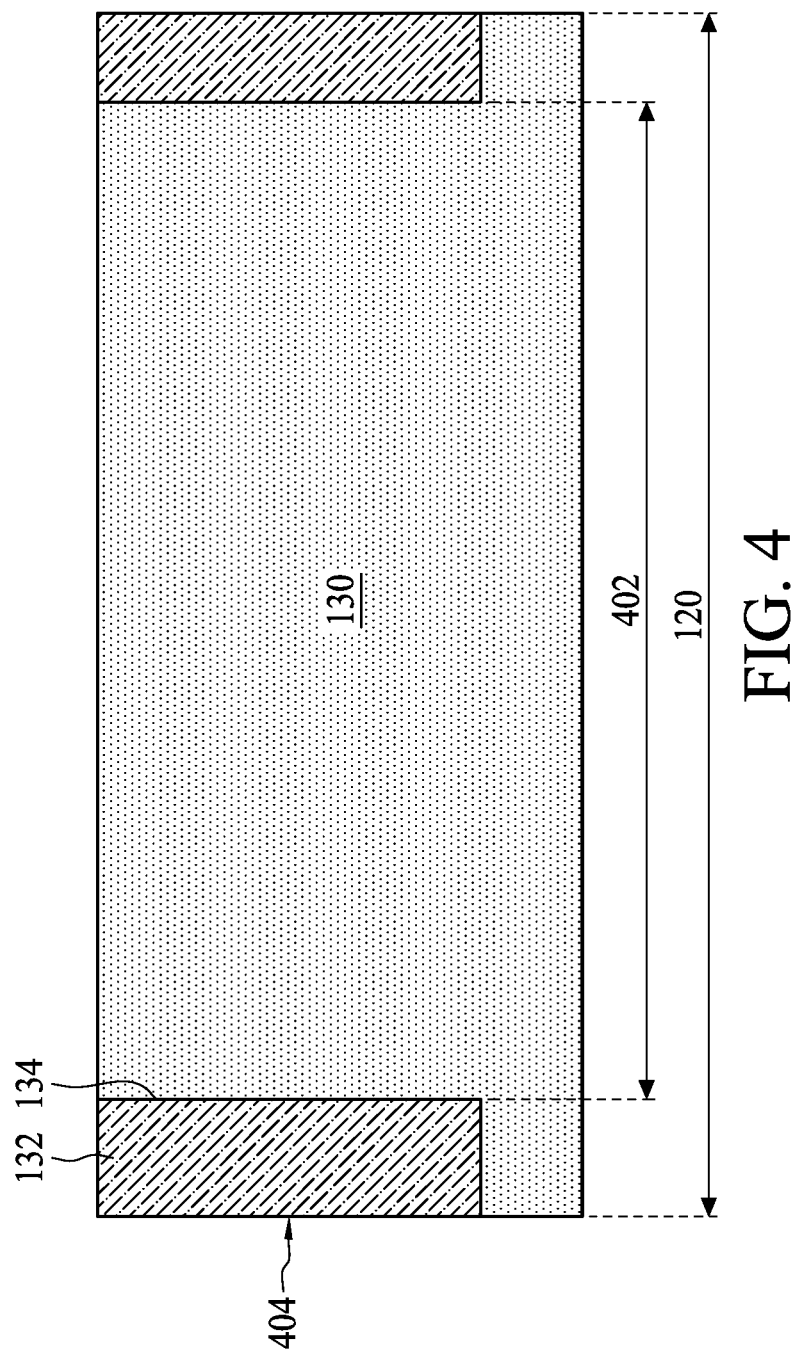
FIGS. 4 through 13 illustrate cross-sectional views of intermediate stages in the formation of a semiconductor structure in accordance with some embodiments of the present disclosure.

Referring to FIG. 4, a substrate 130, including a plurality of line-shaped active areas 402 and an isolation structure 404 between the line-shaped active areas 402 to isolate the line-shaped active areas 402, is provided according to a step 602 in FIG. 3. In some embodiments, the substrate 130 may comprise bulk silicon. In some embodiments, the formation of the line-shaped active areas 402 and the isolation structure 404 may include (1) forming a first photoresist pattern (not shown) on the substrate 130, wherein the first photoresist pattern defines a trench pattern to be etched into the substrate 130, (2) performing a first etching process, such as a dry etching process, using the first photoresist pattern as a mask, to etch the substrate 130 and thereby form the line-shaped active areas 402 separated from one another by a trench 132, (3) removing the photoresist pattern, and (4) depositing insulating materials 134 such as silicon oxide in the trench 132.

Figure 5:
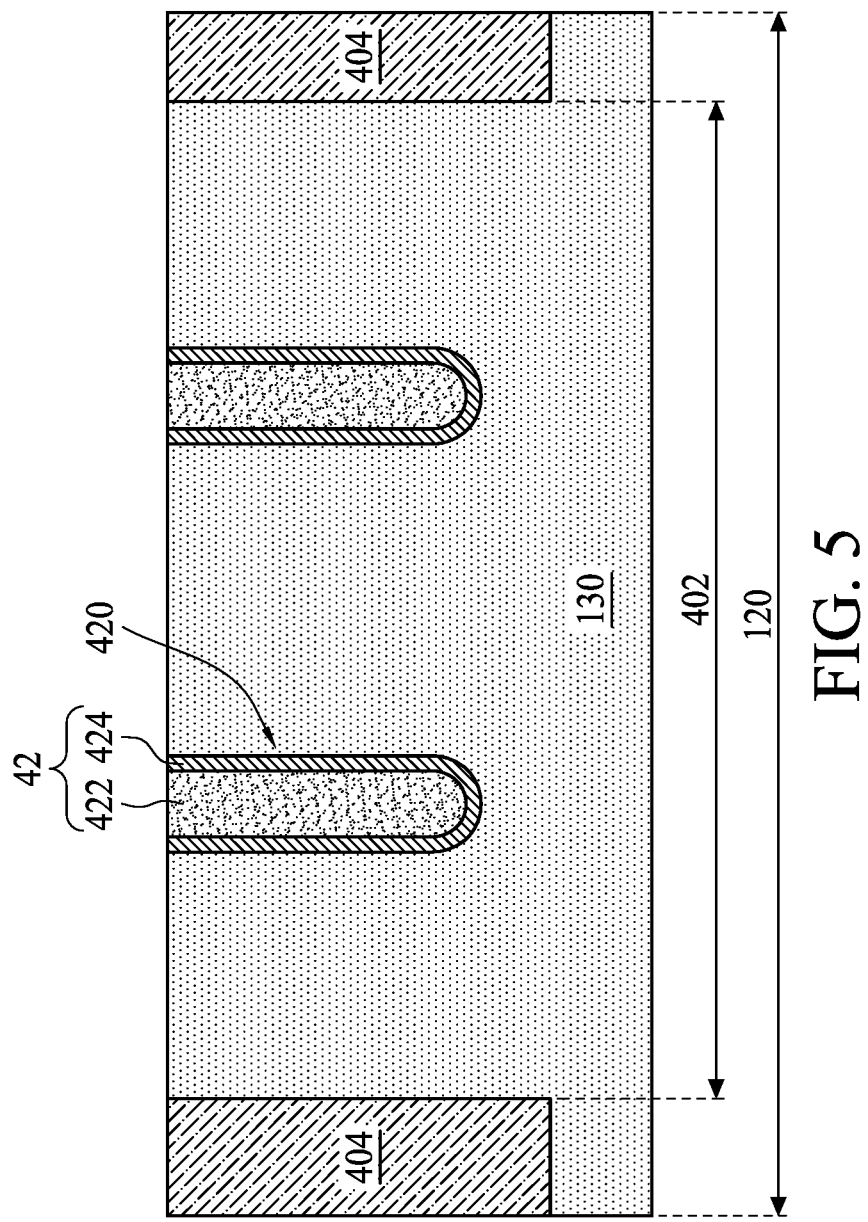

Referring to FIG. 5, in some embodiments, a plurality of buried word lines 42 are fabricated in the substrate 130 according to a step 604 in FIG. 3. In some embodiments, the buried word lines 42 parallel to each other are formed in one of the line-shaped active areas 402. In some embodiments, the formation of the buried word lines 42 may include (1) forming a second photoresist pattern (not shown) on the substrate 130, wherein the second photoresist pattern defines a plurality of word line trench patterns to be etched into the substrate 130 in the line-shaped active areas 402, (2) performing a second etching process, such as a dry etching process, using the second photoresist pattern as a mask, to etch the substrate 130 and thereby form a plurality of word line trenches 420, (3) depositing an insulating liner 424 in the word line trenches 420, and (4) depositing a conductor 422 in the word line trenches 420 such that the conductor 422 is surrounded by the insulating liner 424. In some embodiments, the insulating liner 424 is a conformal layer.

Figure 6:
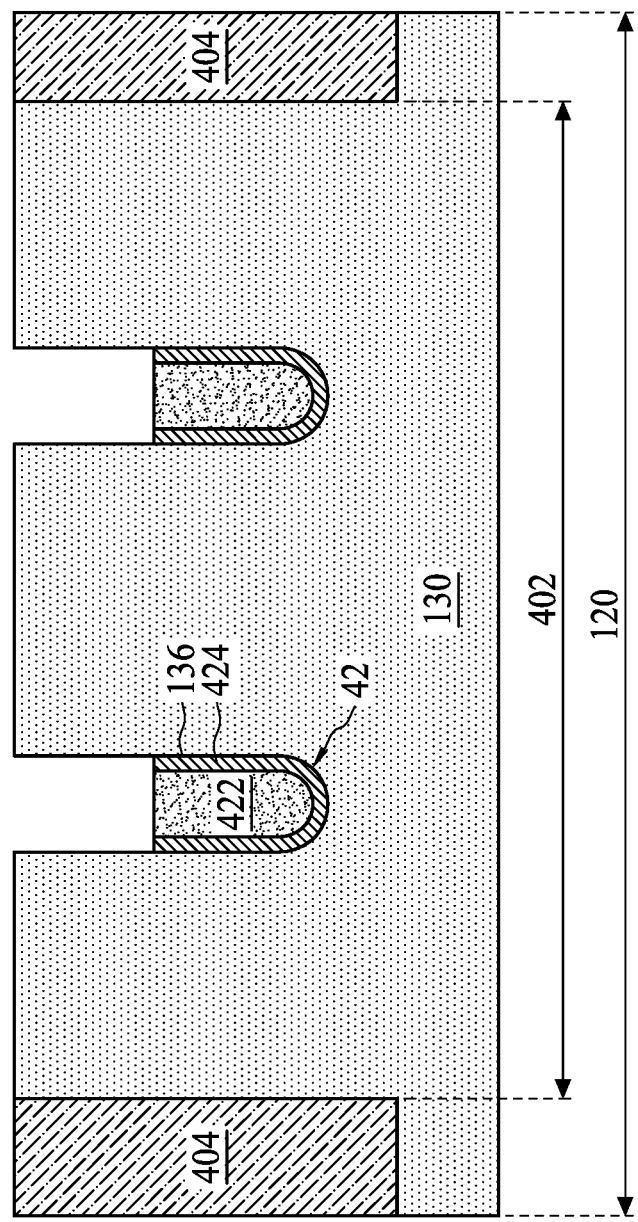

Referring to FIG. 6, in some embodiments, after the deposition of the conductor 422, an etching process may be performed to recess the buried word lines 42 (and the insulating liner 424) into the substrate 130. In some embodiments, the buried word lines 42 are disposed at a lower portion 136 of the word line trenches 420. In some embodiments, the conductor 422 may include titanium nitride (TiN), tungsten nitride (WN), tungsten/tungsten nitride (W/WN), tantalum nitride (TaN), titanium silicon nitride (TiSiN), tantalum silicon nitride (TaSiN), and tungsten silicon nitride (WSiN), or a combination thereof. In some embodiments, the conductor 422 may be formed using a CVD process or an atomic layer deposition (ALD) process.

Figure 7:
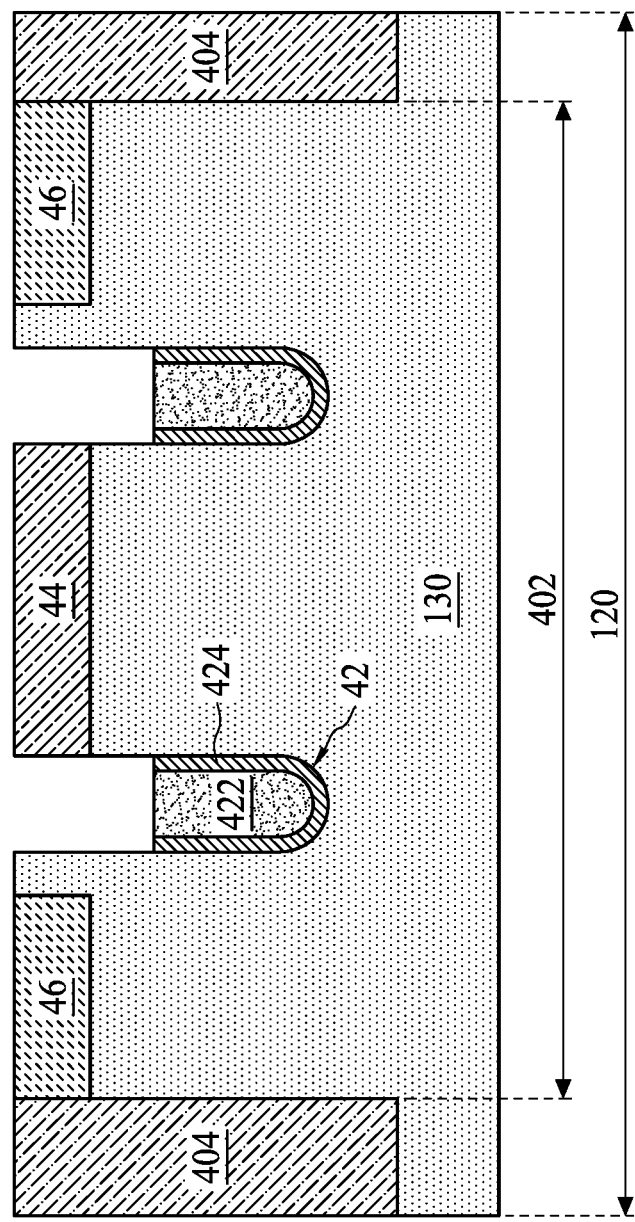

Referring to FIG. 7, in some embodiments, the line-shaped active areas 402 are implanted with ions to form a first diffusion region 44 and a plurality of second diffusion regions 46 according to a step 606 in FIG. 3. In some embodiments, the first diffusion region 44 is an n+ region, and the second diffusion regions 46 are n− regions. In some embodiments, arsenic (As) or phosphorus (P) can be used in the ion implantation process to form the first diffusion region 44 and the second diffusion regions 46. In some embodiments, the first diffusion region 44 and the second diffusion regions 46 may be formed in the substrate 130 using a chemical diffusion process or an ion implantation process to dope the substrate 130.

Figure 8:
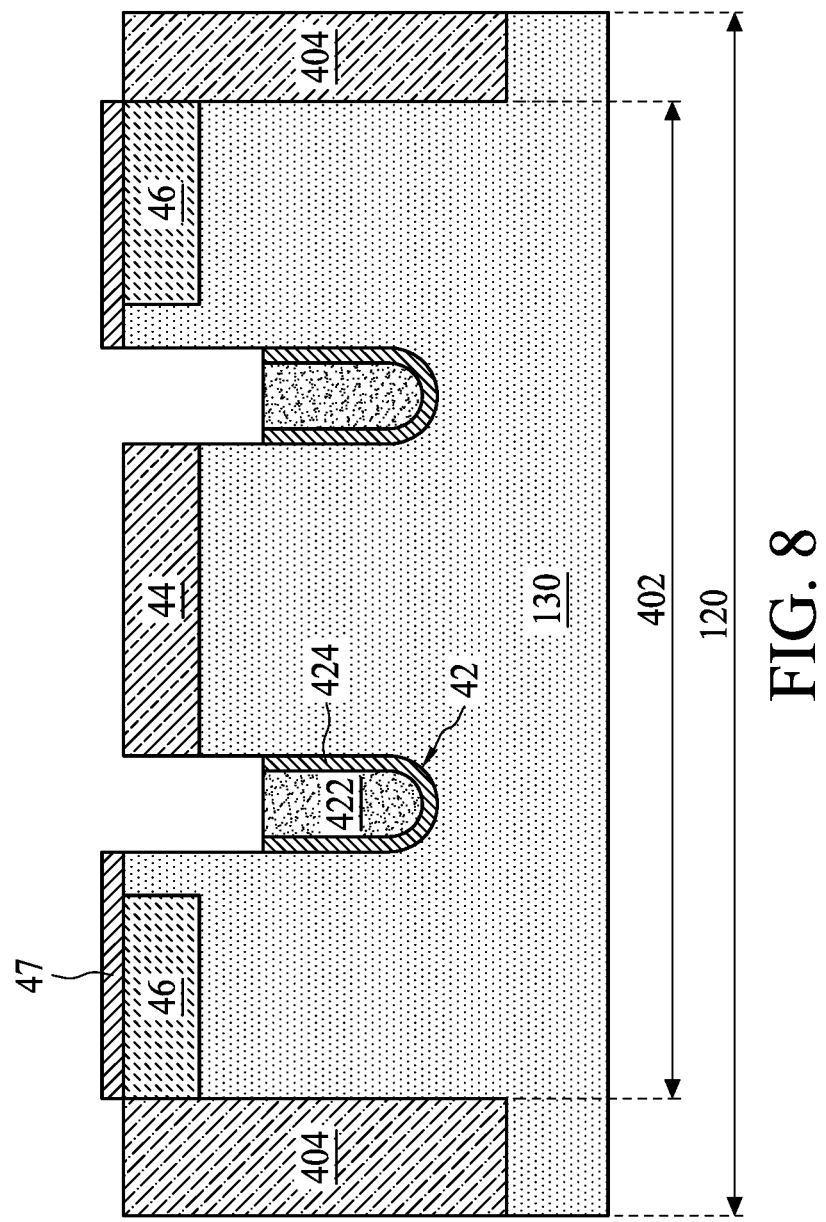

Referring to FIG. 8, in some embodiments, thin cell dielectrics 47 are formed on the second diffusion regions 46 according to a step 608 in FIG. 3. In some embodiments, the cell dielectrics 47 include oxide. In some embodiments, the cell dielectrics 47 may be formed by a CVD process.

Figure 9:
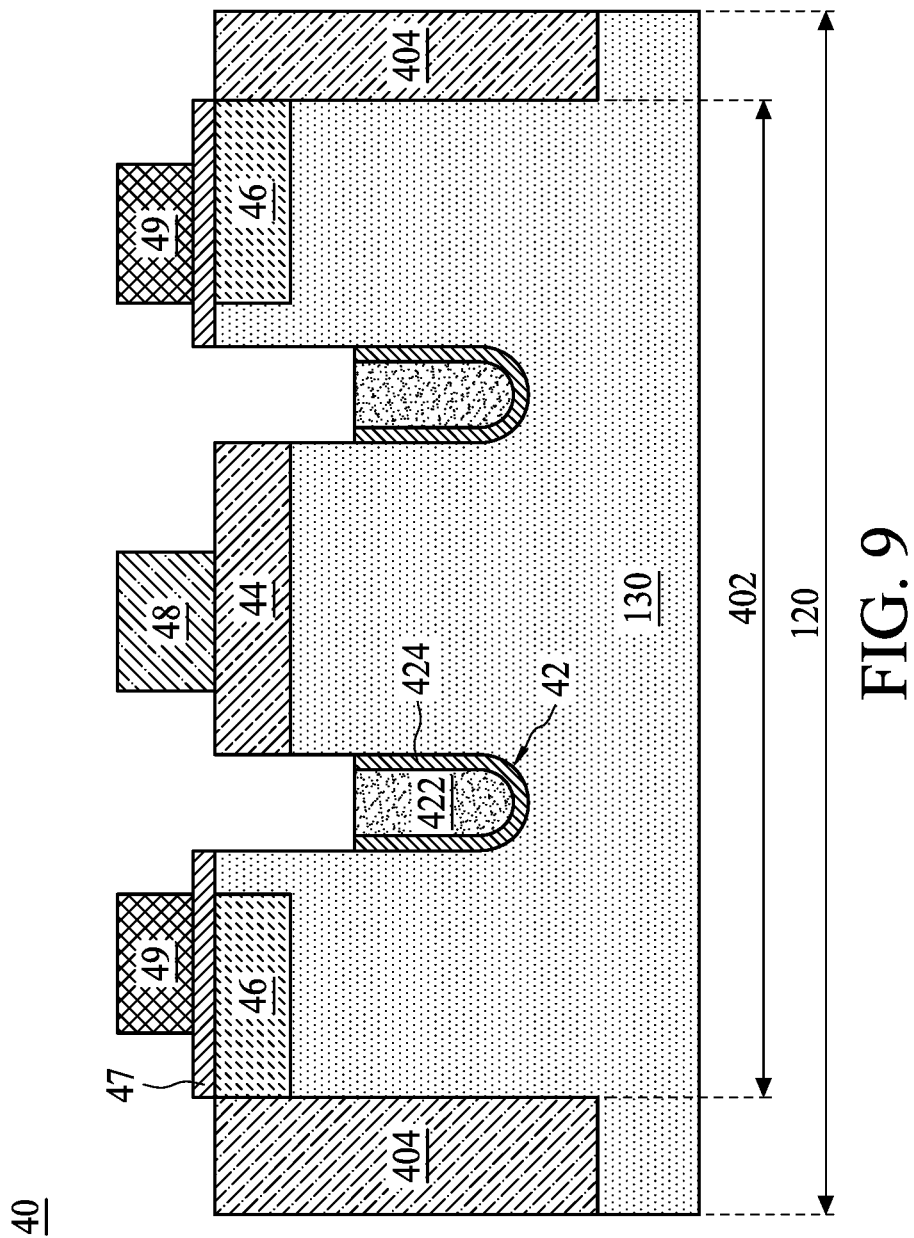

Referring to FIG. 9, in some embodiments, a control bit line 48 is formed on the first diffusion region 44 and a plurality of cell bit lines 49 are formed over the second diffusion regions 46 according to a step 610 in FIG. 3. Accordingly, the OTP device 40 is completely formed. In some embodiments, the control bit line 48 and the cell bit lines 49 may be formed by CVD processes.

Figure 10:
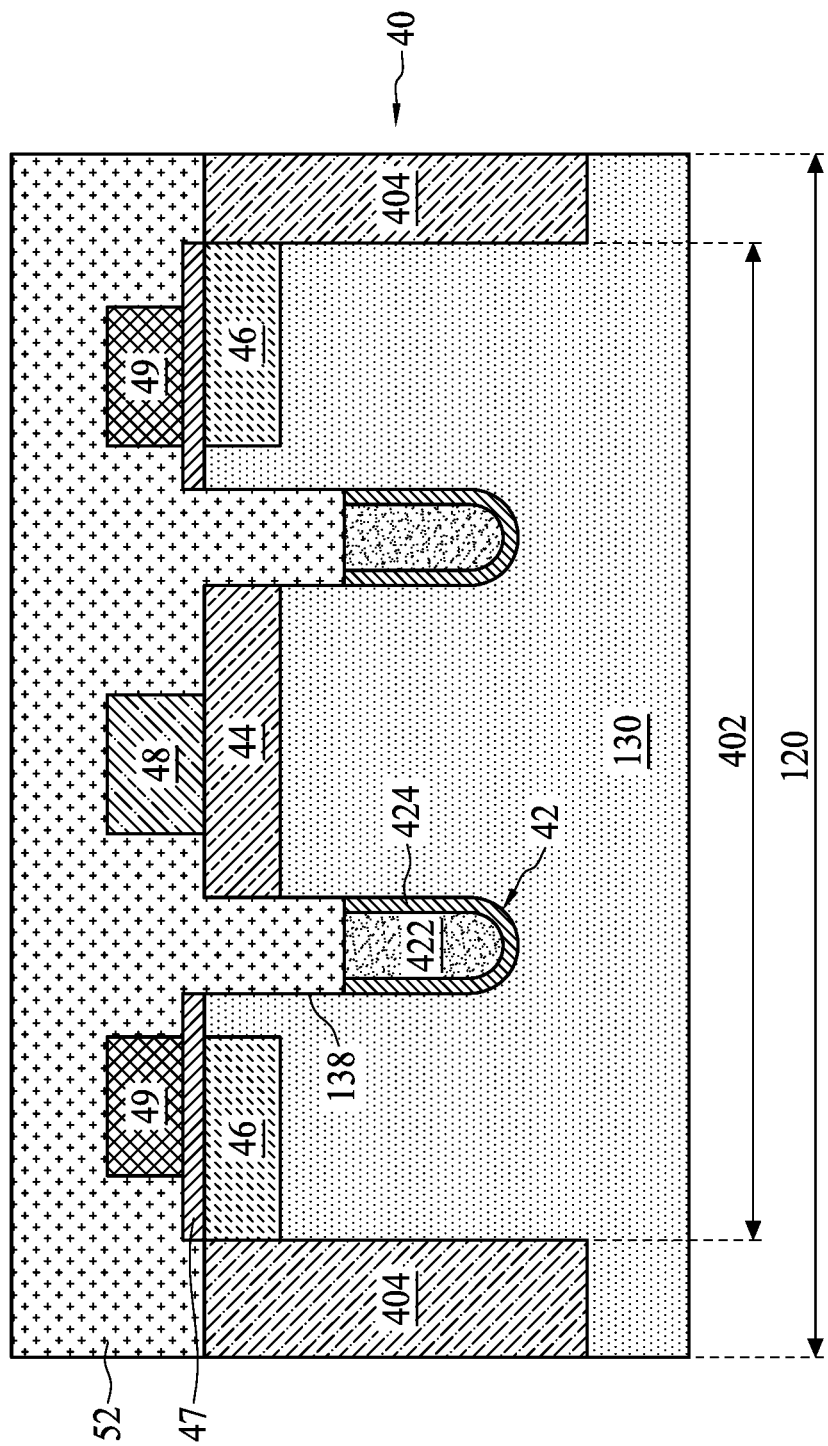

Referring to FIG. 10, in some embodiments, an inter-layer dielectric 52 is deposited to cover the buried word lines 42, the control bit line 48, the cell bit lines 49 and portions of the substrate 130 according to a step 612 in FIG. 3. In some embodiments, the inter-layer dielectric 52 covers sidewalls 138 of the substrate 130 that exposed through the buried word lines 42. In some embodiments, the inter-layer dielectric 52 is typically deposited with a low-pressure CVD process or a plasma-enhanced CVD process. In some embodiments, after the inter-layer dielectric 52 is deposited, a planarization process using any suitable method such as a chemical CMP process, is optionally performed on the inter-layer dielectric 52 for providing better topography.

Figure 11:
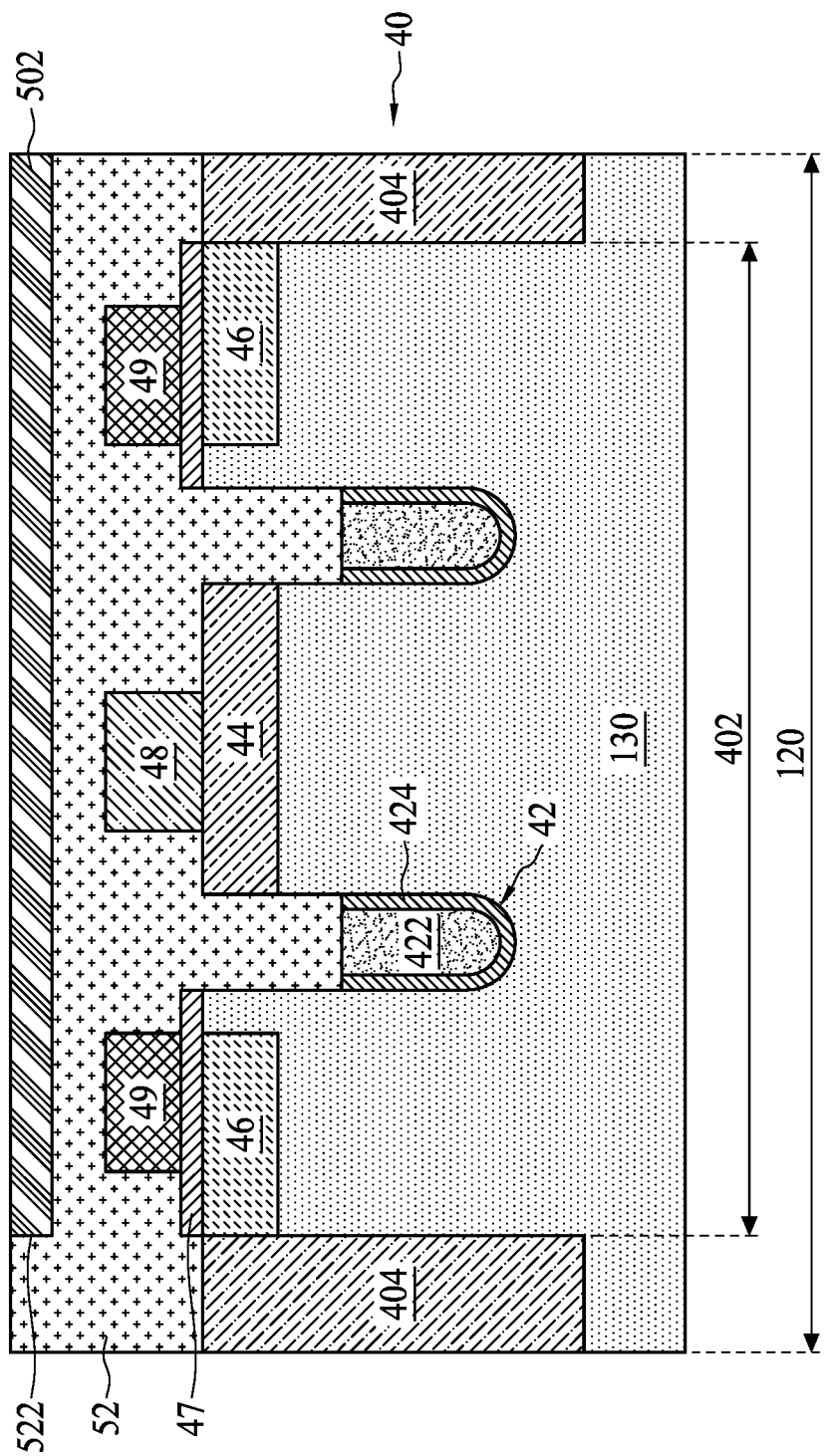

Referring to FIG. 11, in some embodiments, a first conductive layer 502 is deposited in the inter-layer dielectric 52 according to a step 614 in FIG. 3. In some embodiments, the formation of the first conductive layer 502 includes (1) forming a third photoresist pattern (not shown) on the inter-layer dielectric 52, wherein the third photoresist pattern defines a trench pattern to be etched into the inter-layer dielectric 52, (2) performing a third etching process, using the third photoresist pattern as a mask, to etch the inter-layer dielectric 52 and thereby form an opening 522 in the inter-layer dielectric 52, (3) removing the photoresist pattern, and (4) depositing first conductive material in the opening 522. In some embodiments, the first conductive material may be deposited in the opening 522 by a CVD process. In alternative embodiments, the first conductive layer 502 may be formed on the inter-layer dielectric 52.

Figure 12:
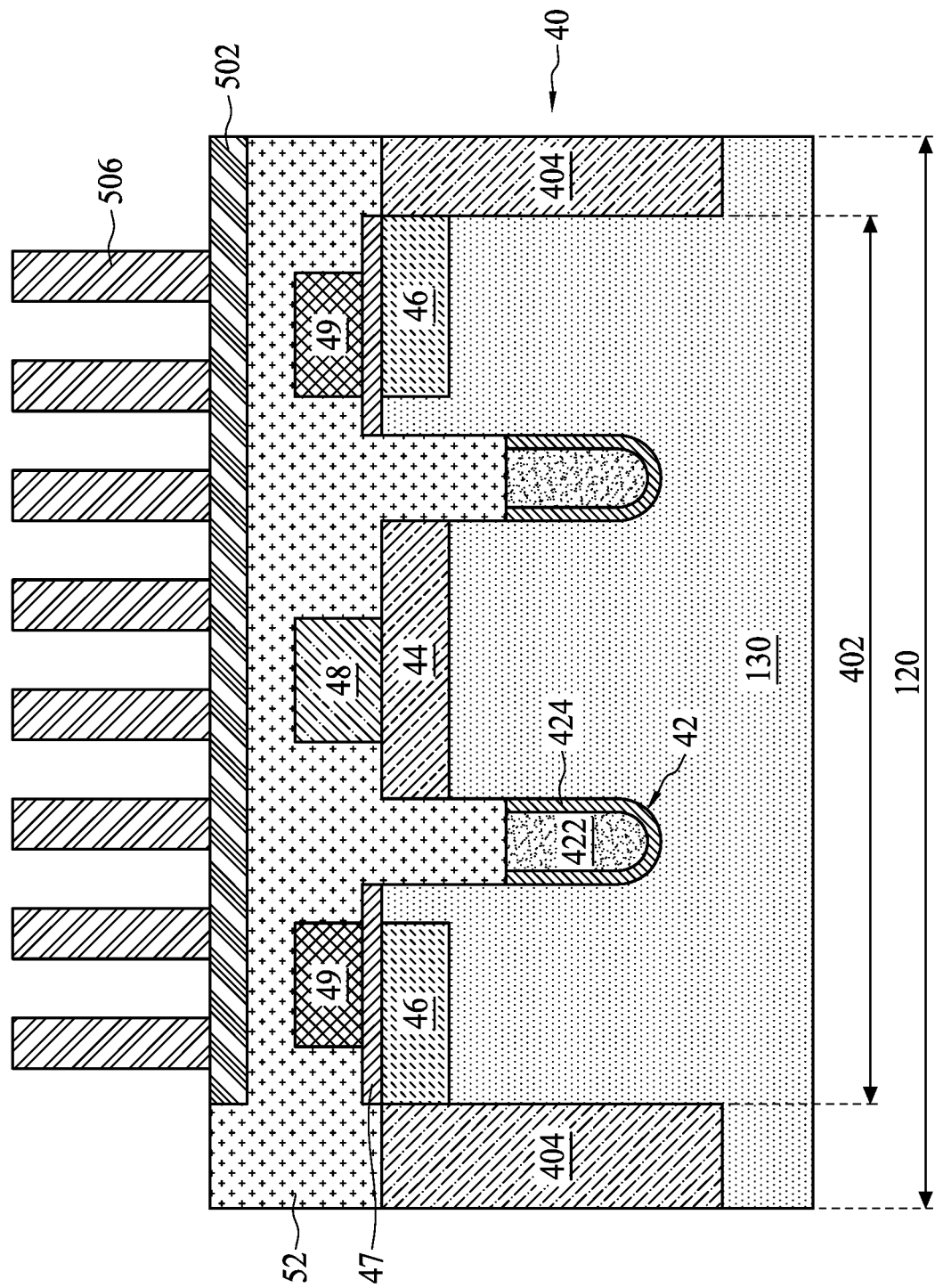

Referring to FIG. 12, in some embodiments, an insulating layer 506 is deposited on the first conductive layer 502 according to a step 616 in FIG. 3. In some embodiments, the insulating layer 506 may be formed by a CVD process. In some embodiments, the insulating layer 506 may be formed by depositing a blanket insulating layer 506 on the first conductive layer 502 and then performing a patterning process to formed strips spaced apart from one another by a given distance.

Figure 13:
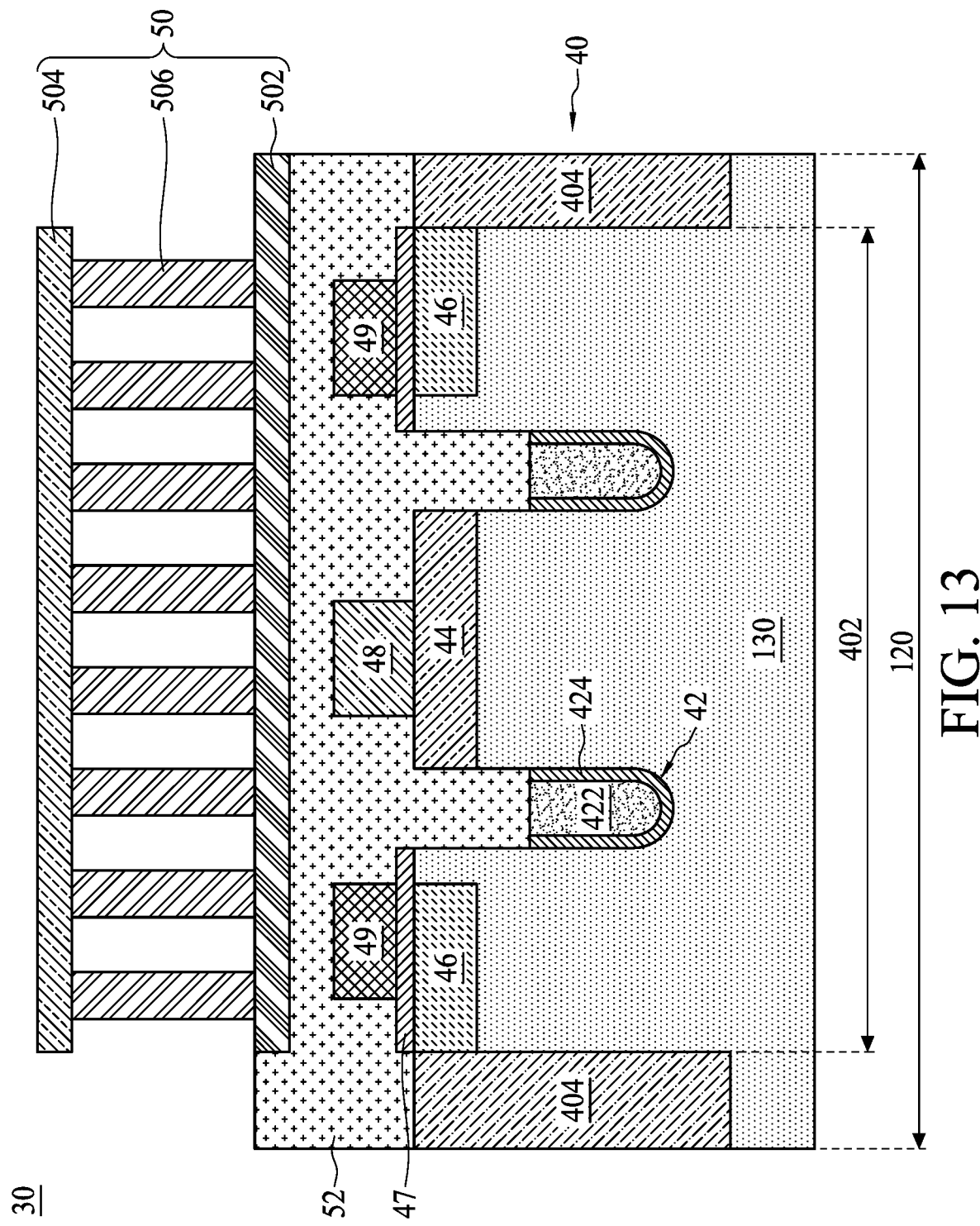

Referring to FIG. 13, in some embodiments, a second conductive layer 504 is deposited on the insulating layer 506 according to a step 618 in FIG. 3. In some embodiments, the second conductive layer 504 may be formed by a CVD process. Accordingly, the decoupling capacitor array 50 and the semiconductor structure 30 are completely formed.

One aspect of the present disclosure provides a semiconductor structure. The semiconductor structure includes a substrate, a plurality of one-time-programmable (OTP) cells and a decoupling capacitor array. The substrate includes a plurality of active areas and an isolation structure provided between the active areas to isolate the active areas from one another. The plurality of one-time-programmable (OTP) cells are disposed in the active areas, and the decoupling capacitor array overlies the OTP cells.

One aspect of the present disclosure provides a semiconductor chip including a first region and a second region, wherein the first region includes a main device, the second region includes a one-time-programmable (OTP) device and a decoupling capacitor array, and the decoupling capacitor array vertically overlies the OTP device.

One aspect of the present disclosure provides a method of manufacturing a semiconductor structure. The method includes steps of providing a substrate formed with a plurality of line-shaped active areas and an isolation structure provided between the line-shaped active areas to isolate the line-shaped active areas; forming a plurality of buried word lines in the line-shaped active area; implanting ions in the line-shaped active areas to form a first diffusion region and a plurality of second diffusion regions on either side of the buried word lines; depositing cell dielectrics on the second diffusion regions; depositing a control bit line on the first diffusion region and a plurality of cell bit lines on the cell dielectrics; depositing an inter-layer dielectric on the buried word lines, the control bit line, and the cell bit lines; depositing a first conductive layer on the inter-layer dielectric; depositing an insulating layer on the first conductive layer; and depositing a second conductive layer on the insulating layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor structure, comprising:
a substrate comprising a plurality of active areas and an isolation structure provided between the plurality of active areas to isolate the plurality of active areas from one another;
a plurality of one-time-programmable (OTP) cells disposed in the plurality of active areas; and
a decoupling capacitor array overlying the plurality of OTP cells.

2. The semiconductor structure of claim 1, further comprising an inter-layer dielectric sandwiched between the plurality of OTP cells and the decoupling capacitor array.

3. The semiconductor structure of claim 1, wherein at least one of the plurality of OTP cells comprises:

a first diffusion region in the substrate;
a control bit line disposed on the first diffusion region;
a plurality of second diffusion regions in the substrate and at opposite sides of the first diffusion region;
a plurality of buried word lines in the substrate and between the first diffusion region and the plurality of second diffusion regions;
a plurality of cell dielectrics disposed on the plurality of second diffusion regions; and
a plurality of cell bit lines disposed on the plurality of cell dielectrics.

4. The semiconductor structure of claim 3, wherein the plurality of active areas extend along a first direction, the plurality of buried word lines extend along a second direction and intersect with the plurality of active areas at an angle of less than 90 degrees, and the control bit line and the plurality of cell bit lines extend along a third direction substantially perpendicular to the second direction.

5. The semiconductor structure of claim 4, wherein the angle is in a range between 15 and 60 degrees.

6. The semiconductor structure of claim 3, wherein at least one of the plurality of buried word lines comprises:
a conductor disposed in the substrate; and
an insulating liner disposed between the substrate and the conductor.

7. The semiconductor structure of claim 1, wherein the decoupling capacitor array comprises:
an insulating layer;
a first conductive layer disposed over the plurality of OTP cells and beneath the insulating layer; and
a second conductive layer disposed on the insulating layer.

8. A semiconductor chip, comprising:
a first region including a main device;
a second region including a one-time-programmable (OTP) device and a decoupling capacitor array vertically overlying the OTP device.

9. The semiconductor chip of claim 8, further comprising a substrate extending to comprise a portion of the main device and a portion of the OTP device.

10. The semiconductor chip of claim 9, wherein the OTP device comprises a plurality of OTP cells, wherein at least one of the plurality of OTP cells is disposed in an active area of the substrate and comprises:
a first diffusion region in the substrate;
a control bit line disposed on the first diffusion region;
a plurality of second diffusion regions in the substrate and at opposite sides of the first diffusion region;
a plurality of buried word lines in the substrate and between the first diffusion region and the plurality of second diffusion regions;
a plurality of cell dielectrics disposed on the plurality of second diffusion regions; and
a plurality of cell bit lines disposed on the plurality of cell dielectrics.

11. The semiconductor chip of claim 10, further comprising an inter-layer dielectric covering the control bit line, the plurality of buried word lines, the plurality of cell bit lines and a portion of the substrate.

12. The semiconductor chip of claim 11, wherein the decoupling capacitor array comprises:
a first conductive layer formed on the inter-layer dielectric;
a second conductive layer disposed over the first conductive layer; and
an insulating layer between the first conductive layer and the second conductive layer.

13. The semiconductor chip of claim 11, wherein the main device comprises a plurality of access transistors and a plurality of storage capacitors disposed over the plurality of access transistors and electrically coupled to the plurality of access transistors.

14. The semiconductor chip of claim 13, wherein the main device further comprises an isolation layer disposed between each of the plurality of access transistors and each of the plurality of storage capacitors, and comprises a plug disposed in the isolation layer and connecting the access transistor to the storage capacitor; and the decoupling capacitor array is electrically isolated from the OTP device.

\* \* \* \* \*